United States Patent [19]
Murata

[11] Patent Number: 5,137,677
[45] Date of Patent: Aug. 11, 1992

[54] HALL SENSOR DEVICE AND METHOD OF PRODUCING THE SAME

[75] Inventor: Shigemi Murata, Himeji, Japan

[73] Assignee: Mitsubishi Denki K.K., Tokyo, Japan

[21] Appl. No.: 490,204

[22] Filed: Mar. 8, 1990

[30] Foreign Application Priority Data

Mar. 9, 1989 [JP] Japan ................... 1-54915

[51] Int. Cl.$^5$ .................. B29C 45/14; H01L 43/00
[52] U.S. Cl. ................ 264/272.16; 264/272.18; 264/272.19; 338/32 H
[58] Field of Search ............. 338/32 H, 32 R; 174/257, 260; 357/1, 2; 264/272.16–272.18, 61, 272.19

[56] References Cited

U.S. PATENT DOCUMENTS

| | | | |
|---|---|---|---|
| 4,156,820 | 5/1979 | Fukuda et al. | 338/32 H |
| 4,296,424 | 10/1981 | Shibasaki et al. | 174/257 X |
| 4,359,978 | 12/1982 | Brammer et al. | 123/146.5 A |

*Primary Examiner*—Marvin M. Lateef
*Attorney, Agent, or Firm*—Sughrue, Mion, Zinn, Macpeak & Seas

[57] ABSTRACT

An integrally molded Hall sensor device for detecting the crankshaft angle of an automotive engine. The injection mold includes a projection 1a extending into a cavity and having a width equal to that of a gap through which a magnetic shutter passes. Before the molding, the parts are assembled utilizing a skeletal frame having first and second opposing pairs of vertically extending guide members, and the inserted electrical conductor for the Hall IC is embedded in the frame. The Hall IC and associated parts are accommodated in a holder, which is thereafter fitted between the first pair of guide members, to be translatable toward the gap; a magnetic circuit member including a permanent magnet is fitted between the second pair of the guide members to be translatable toward the gap. The assembled parts are then put into the mold such that the surfaces flanking the gap are positioned at respective sides of the projection. A flowing resin is injected into the mold such that the holder and the magnetic circuit member are driven by the flow against the respective side surfaces of the projection. Thus, the width of the gap can be precisely determined by the width of the projection without utilizing jigs.

4 Claims, 2 Drawing Sheets

HALL SENSOR DEVICE AND METHOD OF PRODUCING THE SAME

BACKGROUND OF THE INVENTION

This invention relates to Hall sensor devices which can suitably be utilized, for example, for the detection of the crankshaft angle of an internal combustion engine for controlling the ignition timing. This invention relates also to a method of producing such devices.

Various Hall sensor devices utilizing the Hall effect for converting the variations of magnetic flux into an electrical signal are well known; they include, for example, position sensors, angle sensors, and velocity sensors. In particular, Hall sensor devices are utilized for detecting the crankshaft angle of an automotive engine in the contactless type ignition system. Further, Hall IC's (ingegrated circuits) which incorporate a Hall element in a hybrid integrated circuit are also well known. Furthermore, Hall sensor devices in which such a Hall IC is accomodated integrally with a magnetic circuit in a resinous casing or frame are also known.

However, the last-mentioned integrally molded Hall sensor devices still have the following disadvantges. Namely, during the molding process of the casing or frame, the constitutive parts of the Hall sensor device, such as the Hall IC or the magnetic circuit parts, should be precisely positioned and fixed within a mold, utilizing a number of jigs for the respective parts; thermoplastic or thermosetting resin is poured into the mold while the parts are thus kept in their respective positions, to be dried or set in a heating furnace, thereby forming the casing or the frame. Thus, the process is in need of a multitude of jigs for folding the parts at their respective positions during the molding step, and the accuracy of the positioning of the parts is low; as a result the process is not suitable for automated mass production; in addition, the Hall sensor devices produced by this process have low signal precision.

SUMMARY OF THE INVENTION

A primary object of this invention is therefore to provide an integrally molded Hall sensor device which has a high signal precision while at the same time can be produced by a molding process in which various parts can be assembled and positioned easily and which lends itself readily to automation; this invention also aims at providing a method for producing such Hall sensor devices.

The above objects are accomplished in accordance with the principle of this invention in a Hall sensor device for generating an electrical signal corresponding to a movement of a magnetic shutter, which device comprises: a Hall sensor element, such as a Hall IC, for converting a variation of magnetic flux into an electrical signal; a thin protective plate, made for example of stainless steel, covering a sensor surface of the Hall sensor element; a magnetic circuit member having a surface opposing, across a gap of a predetermined width, the thin protective plate covering the sensor surface of the Hall sensor element, wherein the gap receives the magnetic shutter therein, such that the Hall sensor element generates an electrical signal corresponding to the movement of the magnetic shutter through the gap; and an integral bulk of a molded resin material in which the Hall sensor element, the thin protective plate, and the magnetic circuit member are integrally embedded, wherein surfaces of the thin protective plate and the magnetic circuit element opposing to each other across the gap of the predetermined width are exposed at the gap.

In a preferred form, the Hall sensor device further comprises: electrical connection means embedded integrally in the resin material for electrically connecting a lead of the Hall sensor element to an outside circuit; and a first magnetic flux guide made of a magnetic material and embedded integrally in the resin material, which guide is in contact with a surface of the Hall sensor element at one end thereof and has a surface exposed to the gap. Further, the magnetic circuit member preferrably comprises: a permanent magnet having a surface opposing the thin protective plate across the gap; and a second magnetic flux guide made of a magnetic material, which guide is in contact with a surface of the permanent magnet at one end thereof, wherein a surface of the second magnetic flux guide is exposed to the gap so as to oppose across the gap the surface of the first magnetic flux guide exposed to the gap.

The above Hall sensor device is produced in accordance with the principle of this invention by a method which comprises the following steps: the step of preparing a mold having a projection extending into a cavity thereof and having a width corresponding to the predetermined width of the gap of the Hall sensor device; the step of disposing the Hall sensor element within the cavity of the mold at a side of the projection, the thin protective plate being interposed between the Hall sensor element and the projection, in such a manner that the Hall sensor element is capable of being translated together with the thin protective plate in a direction toward the projection; the step of disposing the magnetic circuit member within the cavity of the mold at an opposite side of the projection in such a manner that the magnetic circuit member is capable of being translated in a direction toward the projection; the step of supplying a flowing resin material into the cavity of the mold in such a manner that the Hall sensor element together with the thin protective plate at one side of the projection, and the magnetic circuit member at the other side of the projection, are driven and translated toward the projection by flows of the resin material supplied into the cavity, so that opposing surfaces of the thin protective plate and the magnetic circuit member abut on respective surfaces of the projection; and the step of taking the integrally molded Hall sensor device out of the mold after the resin material is set.

It is preferred that the assembling of the parts before the molding process comprise the steps of: pre-molding a skeletal frame of a resin material, which frame includes a first and a second opposing pair of parallelly extending guide members, the electrical connection means being molded integrally with the skeletal frame; assembling in a holder the Hall sensor element, the thin protective plate and the first magnetic flux guide; assembling the permanent magnet and the second magnetic flux guide to obtain the assembled magnetic circuit member; fitting between the first opposing pair of guide members of the pre-mold skeletal frame the holder within which the Hall sensor element, the thin protective plate, and the first magnetic flux guide are assembled in such a manner that the holder is translatable in a direction toward the gap; and fitting between the second opposing pair of guide members of the pre-mold skeletal frame the second magnetic flux guide to which the permanent magnet is assembled in such a manner that the magnetic circuit member is translatable in a direction toward the gap. Thereafter, the pre-mold skeletal frame, to which the holder, accommodating the Hall sensor element, the thin protective plate, and the first magnetic flux guide, and the second magnetic flux guide of the magnetic circuit member are fitted, are disposed within the cavity of the mold, so that the opposing surfaces of the thin protective plate and the permanent magnet and the opposing surfaces of the first and the second magnetic flux guides are disposed at respective sides of the projection.

Thus, according to this method, the width of the gap of the Hall sensor device is precisely determined by that of the projection of the mold without utilizing any special jigs during the molding process.

BRIEF DESCRIPTION OF THE DRAWINGS

The novel features which are believed to be characteristic of this invention are set forth with particularity in the appended claims. This invention itself, however, both as to the structure of the device and method of producing it, together with further objects and advantages thereof, may best be understood from the following detailed description of a presently preferred embodiment, taken in connection with the accompanying drawings, in which:

In the drawings, like reference numerals represent like parts.

DETAILED DESCRIPTION OF THE PREFERRED EMBODIMENT

Figure 1:
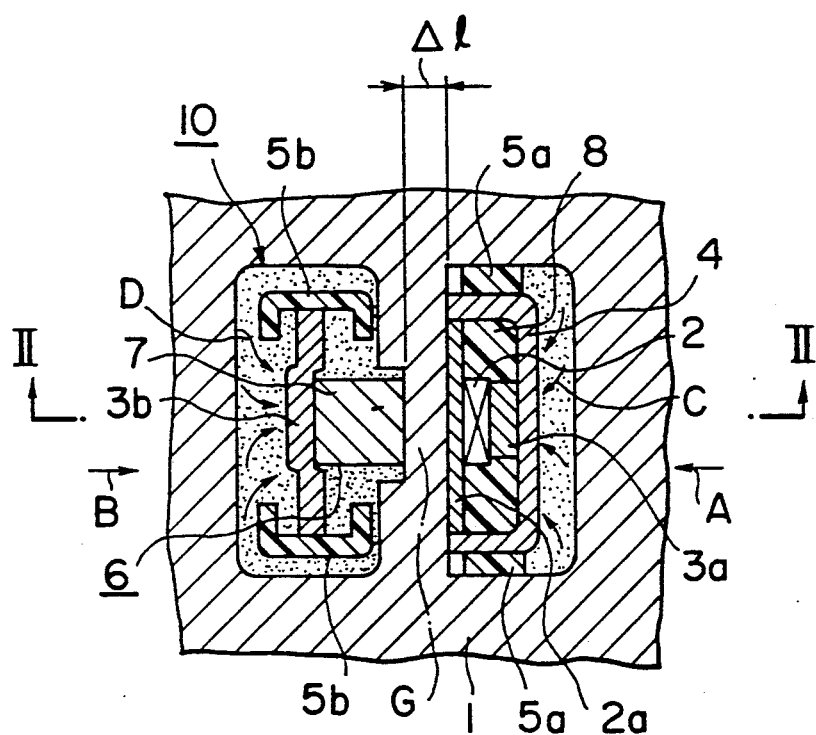
FIG. 1 is a horizontal sectional view of a Hall sensor device according to this invention positioned within a mold during the injection molding step.
Figure 2:
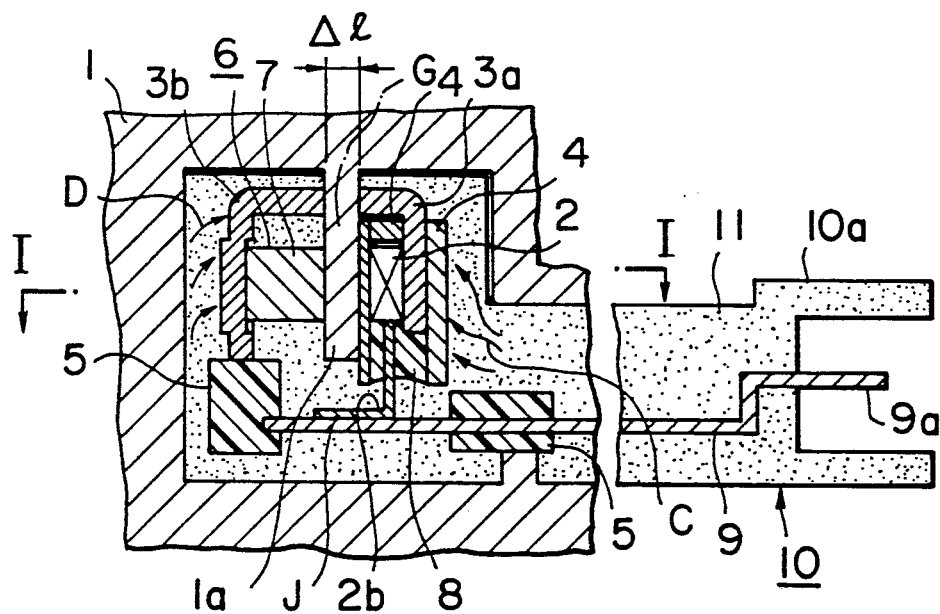
FIG. 2 is a side sectional view of the Hall sensor device of FIG. 1.
Figure 3:
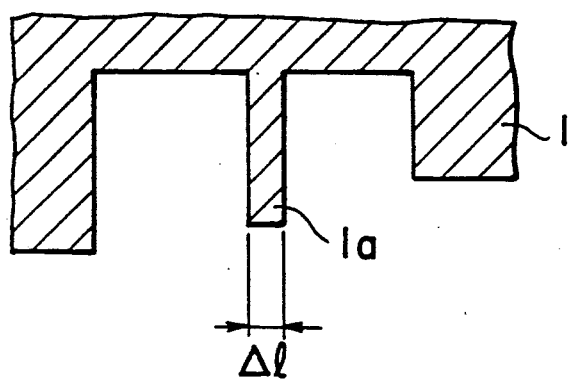
FIG. 3 is a partial side sectional view of the mold utilized in the injection molding process according to this invention.

Referring now to FIGS. 1 to 3 of the drawings, an embodiment of this invention is described.

In FIGS. 1 and 2, a Hall sensor device, generally designated by reference numeral 10, is shown within a mold 1 for effecting the injection molding of the Hall sensor device 10. The mold 1 comprises a vertical projection 1a extending vertically downward from the ceiling of the cavity of the mold 1, so as to form a central gap G of the Hall sensor device through which teeth of a rotating magnetic flux shutter (not shown) pass, as described below. The width $\Delta$ 1 of the central portion of the projection 1a, which determines the distance between the Hall IC 2 and the opposing permanent magnet 7 as described below, is selected according to the design requirements at a predetermined value. The width $\Delta l$ of the projection 1a of the mold is shown clearly in FIG. 3.

Let us now describe the structural organization of the Hall device 10 shown within the mold 1 in FIGS. 1 and 2; first let us describe the portion thereof (including the Hall IC 2) shown to the right of the projection 1a or the gap G in FIGS. 1 and 2:

A Hall IC (integrated circuit) 2, which converts the variation of the magnetic flux into an electrical signal, is disposed at a side (to the right in FIGS. 1 and 2) of the gap G (which is occupied by the projection 1a of the mold 1 during the molding process, as shown in FIGS. 1 and 2), via a thin protection plate 2a of a non-magnetic material such as stainless steel provided for its protection. The Hall IC 2 is supported, together with the thin protection plate 2a and an inverted L-shaped first magnetic flux guide 3a, by a holder 4 having a U-shaped horizontal cross section opening toward the gap G (see FIG. 1). The upper end of the holder 4 is bent toward the gap G so as to form a horizontal extension extending toward the gap G (see FIG. 2), wherein the vertically extending portion first magnetic flux guide 3a extends through the upper horizontal extension of the holder 4. The holder 4 is made of a non-magnetic material such as polybutylene terephthalate (PBT). The holder 4, together with the Hall sensor device 2 and the thin plate 2a, are held between a pair of vertically extending guide members 5a (see FIG. 1) of a pre-mold 5 (see FIG. 2) which is, for example, formed of PBT, such that they are capable of translation, relative to the guide members 5a, in the horizontal direction A (shown at the right in FIG. 1) toward the projection 1a during the injection molding process as described in detail below. Further, an L-shaped lead 2b of the Hall sensor device 2 is electrically coupled to a horizontally extending insert conductor 9 at the lower horizontal base portion J thereof, and the space remaining within the holder 4 and the thin protection plate 2a is filled with a filler material 8, such as silicone resin gel, for protecting the Hall sensor device 2 disposed therein; as described below, the filler material 8 is filled into the space within the holder 4 before the injection molding process, for the purpose of holding the thin plate 2a, the first magnetic guide 3a, and the holder 4 together.

On the other hand, the parts of the Hall sensor device 10 shown to the left of the gap G or the projection 1a of the mold 1 in FIGS. 1 and 2 are constituted as follows.

A magnetic circuit member, generally designated by reference numeral 6 and shown to the left of the gap G (or the projection 1a) in FIGS. 1 and 2, opposes the Hall IC 2 across the gap G. The magnetic circuit member 6 comprises a rectangular permanent magnet 7, and a plate-shaped second magnetic flux guide 3b to which the magnet 7 is adhered and held; the upper portion of the plate-shaped second magnetic flux guide 3b is bent toward the gap G, so as to oppose the upper horizontal portion of the first magnetic flux guide 3a across the gap G (see FIG. 2). Further, the second magnetic flux guide 3b is held between a pair of vertically extending guide members 5b having opposing U-shaped horizontal cross sections (see FIG. 1) of the pre-mold 5 such that the second magnetic flux guide 3b and the permanent magnet 7 is translatable with respect to the guide members 5b in the horizontal direction B (shown at the left in FIG. 1) toward the projection 1a during the injection molding, as described in detail below.

The above described parts of the Hall sensor device are embedded, by means of an injection molding process as described below, in a resinous material 11 forming the bulk of the Hall sensor device 10; the resin material 11 such as PBT is supplied, along the directions shown by the arrows C and D in FIGS. 1 and 2, into the cavity of the mold 1 during the injection molding process, as described below. The pre-mold 5 made of a resin material forming a skeletal framework for supporting the parts of the Hall sensor device 10 by means of the vertically extending guide members 5a and 5b thereof, etc., during the injection molding of the resin material 11, is pre-molded integrally with the insert conductor 9 before the injection molding of the resin material 11; the base portion of the pre-mold 5, whose sections are shown in FIG. 2, is formed integrally with the vertically extending guide members 5a and 5b whose horizontal sections are shown in FIG. 1. The end of the insert conductor 9 extending outward into a cavity formed by the resin material 11 (shown at the right in FIG. 2) constitutes a connector pin 9a for the connector portion 10a of the Hall sensor device 10.

Next, a method of producing the Hall sensor device according to this invention will be described.

First, the constituent parts of the Hall sensor device, such as the Hall IC 2, as well as the mold 1 are obtained and prepared; further, the pre-mold 5 including the insert conductor 9 is obtained, for example, by the injection molding process. Incidentally, the Hall IC 2, which consists of a Hall element and a noise protector element, etc., mounted on a ceramic substrate having a printed circuit thereon, is commercially available. On the other hand, the mold 1 may be of any appropriate structural type, such as, for example, the double or triple partition type.

Then, the parts of the Hall sensor device are assembled as follows. First, let us describe the assembling of the parts situated to the right of the gap G in FIGS. 1 and 2. The thin plate 2 and the first magnetic flux guide 3a, together with the Hall IC 2, are fitted into the holder 4; and, after the filler material 8 is filled into the space remaining within the holder 4, the holder 4 is fitted between the pair of Hall IC guide members 5a; it is noted that, as described above, the holder 4 is slidable in the direction A (see FIG. 1) with respect to the guide members 5a. Further, the lead 2b of the Hall IC 2 is spot welded at the portion J thereof (see FIG. 2) to the insert conductor 9 held by the premold 5. On the other hand, the assembling of the parts situated to the left of the gap G in FIGS. 1 and 2 proceeds as follows. The permanent magnet 7 is adhered to the second magnetic flux guide 3b by means of an adhesive, etc., to obtain the magnetic circuit member 6, which is fitted between the guide members 5b of the pre-mold 5; it is noted that, as described above, the magnetic circuit member 6 is slidable in the horizontal direction B (see FIG. 1) with respect to the guide members 5b.

Thereafter, the parts of the Hall sensor device as asssembled as described above are embedded into the resinous material 11 by the injection molding process as follows:

First, the assembled parts are positioned and accommodated within the cavity of the mold 1 at such positions substantially as shown in FIGS. 1 and 2; it should be noted, however, that at the time when the assembled parts are accommodated in the mold 1, gaps (not shown in the figures) are usually formed between a side surface (at the right side in FIGS. 1 and 2) of the projection 1a of the mold 1a and the thin protection plate 2, on the one hand, and between the other side of the projection 1a (at the left in FIGS. 1 and 2) and the magnetic circuit member 6, on the other. Next, the resinous meterial 11 is supplied from outside and injected into the mold 1, wherein the flows of the resinous material 11 are controlled in such a manner that the directions thereof agree with those designated by the arrows C and D at the back of the holder 4 and the second magnetic flux guide 3b, respectively. The methods of control of the flow directions of the resin 11 in the injection molding process are well known; they can be used here without any special limitations, by selecting, for example, such factors as: the sectional areas of the flow passages of the resin 11 transversal to the flow directions, the flow velocity, the temperature of the resin, and the viscosity thereof. Due to the pressure of flow bearing on the back surface of the holder 4 in the direction A toward the projection 1a, the holder 4, together with the Hall IC 2, the first magnetic flux guide 3a and the thin plate 2a, is translated in the direction A, so as to be pressed against a side of the projection 1a at the surface of the thin plate 2a opposed thereto. On the other hand, the pressure of flow bearing on the back surface of the second magnetic flux guide 3b in the direction B translates the magnetic circuit member 6 in the same direction B toward the projection 1a, to press the magnetic circuit member 6 against the other side of the projection 1a of the mold 1 at the surface of the magnet 7 opposing it. Thus, the gap G of the Hall sensor device 10 is determined precisely as designed, by the thickness $\Delta l$ of the projection 1a of the mold; as a result, the dispersion or scattering of the dimensions of the gap G among the product Hall sensor devices can be minimized to a negligible level.

The following advantages result from the above assembling and molding process of the Hall sensor device 10 according to this invention. The first advantage is this: since the width of the gap G is determined precisely as described above, the precision of the signal generation of the Hall sensor device is enhanced. A further advantage is that no special jig devices are necessary for the positioning and fixing of the various parts during the injection molding of the resin material 11; in additon, there is the advantage that the positioning and the fixing together of the parts of the device in the assembling step thereof can be effected simply by fitting the respective parts into respective predetermined positions, with the resulting advantage that the assembling step can be easily automated. Furthermore, the Hall sensor device obtained by the above process is robust and is suitable to be used in severe service conditions; namely, since the Hall sensor device is embedded in the resinous material 11 except for the opposing surfaces of the thin plate 2a for protecting the Hall IC 2 and the magnetic circuit member 6, the device is highly resistant, for example, to corrosive gases which may be present in an appreciable amount in the ambient atmosphere in the case where the Hall sensor device 10 is utilized under severe service conditions.

As is well known to those skilled in the art, the Hall sensor device according to this invention as described above can be utilized as a crankshaft angle detector for an internal combustion engine of an automobile, etc. In such a case, a magnetic flux shutter (not shown), having, for example, the form of a hollow cylinder with circumferentially spaced teeth or projections passing through the gap G, is rotated in synchrony with the internal combustion engine, so that the Hall IC may detect the variaton of the magnetic flux corresponding to the rotation of the engine. Then, the Hall IC 2 outputs, by means of the well known Hall effect, an electrical signal corresponding to the rotation of the magnetic flux shutter; this electrical signal is supplied, for example, to a waveform shaper circuit (not shown), whereby the crankshaft angle of the rotating engine is detected.

While description has been made of a particular embodiment of this invention, it will be understood that many modifications may be made without departing from the spirit thereof. For example, although the case where the Hall sensor device is utilized for the detection of the angle of the crankshaft of an internal combustion engine for the purpose of the ignition timing control, it goes without saying that the Hall sensor device according to this invention can be utilized as a position or a velocity sensor. Further, the magnetic flux shutter may be translated linearly. In addition, the thin protection plate 2a may be constituted by the substrate for mounting and packaging the Hall IC 2, so that the material of the plate 2a is not limited to stainless steel. The appended claims are contemplated to cover any such modifications as fall within the true spirit and scope of this invention.

What is claimed is:

1. A method of producing a Hall sensor device for generating an electrical signal of the type comprising a Hall sensor element disposed on a first side of a projection for converting a variation in magnetic flux into an electrical signal, a thin protective plate disposed between said first side of said projection and said Hall sensor element for covering a sensor surface of the Hall sensor element, and a magnetic circuit member disposed on a second side of said projection having an exposed surface opposing across a gap of said thin protective plate that covers said sensor surface of said Hall sensor element, said gap being of a predetermined width and capable of receiving said magnetic shutter therein such that said Hall sensor element generates an electrical signal corresponding to a movement of said magnetic shutter through said gap, said method comprising the steps of:

preparing a mold of resin material for integrally embedding said Hall sensor element, said thin protective plate, and said magnetic circuit wherein said projection is formed which extends into a cavity thereof and has a width corresponding to the predetermined width of said gap;

disposing the Hall sensor element within the cavity of the mold at said first side of projection, the thin protective plate being interposed between the Hall sensor element and the projection in such a manner that the Hall sensor element is translated together with the thin protective plate in a direction toward the projection;

disposing the magnetic circuit member within the cavity of the mold at said second side of the projection such that the magnetic circuit member is translated in a direction toward the projection;

supplying a flow of said resin material into the cavity of the mold such that the Hall sensor element together with the thin protective plate and the magnetic circuit member are driven and translated toward the projection by force of the resin material flowing into the cavity, so that said opposing surfaces of the thin protective plate and the magnetic circuit member abut on respective surfaces of the projection; and removing the integrally molded Hall sensor device out of the mold after the resin material has set.

2. A method of producing a Hall sensor device for generating an electrical signal of the type comprising a Hall sensor element disposed on a first side of a projection for converting a variation in magnetic flux into an electrical signal, a thin protective plate disposed between said first side of said projection and said Hall sensor element for covering a sensor surface of the Hall sensor element, a magnetic circuit member comprising a permanent magnet disposed on a second side of said projection having an exposed surface opposing across a gap of said thin protective plate that covers said sensor surface of said Hall sensor element, said gap being of a predetermined width and capable of receiving said magnetic shutter therein such that said Hall sensor element generates an electrical signal corresponding to a movement of said magnetic shutter through said gap, electrical connection means embedded in said mold of resin material for electrically connecting a lead of said Hall sensor element to an outside circuit, a first magnetic flux guide made of a magnetic material and embedded in said mold of resin material, said guide being in contact with a surface of said Hall sensor element at one end thereof and having a surface exposed to said gap; and a second magnetic flux guide made of a magnetic material in contact with a surface of said permanent magnet at one end thereof, wherein a surface of said second magnetic flux guide is exposed to said gap so as to oppose across said gap said surface of said first magnetic flux guide exposed to said gap; said method comprising the steps of:

preparing a mold having said projection extending into a cavity thereof;

pre-molding a skeletal frame of a resin material, which includes a first and a second opposing pair of parallelly extending guide members, said electrical connection means being molded integrally with the skeletal frame;

assembling in a holder the Hall sensor element, the thin protective plate and the first magnetic flux guide;

assembling the permanent magnet and the second magnetic flux guide to obtain the assembled magnetic circuit member;

fitting between the first opposing pair of guide members of the pre-mold skeletal frame the holder within which the Hall sensor element, the thin protective plate, and the first magnetic flux guide are assembled, in such a manner that the holder is translatable in a direction toward the gap;

fitting between the second opposing pair of guide members of the pre-mold skeletal frame the second magnetic flux guide to which the permanent magnet is assembled, in such a manner that the magnetic circuit member is translatable in a direction toward the gap;

disposing within the cavity of said mold the pre-mold skeletal frame to which the holder, accommodating the Hall sensor element, the thin protective plate, and the first magnetic flux guide, and the second magnetic flux guide of the magnetic circuit member are fitted, so that opposing surfaces of the thin protective plate and the permanent magnet and the opposing surfaces of the first and the second magnetic flux guides are disposed at respective sides of the projection;

supplying a flowing resin material into the cavity of the mold in such a manner that the holder, accommodating the Hall sensor element, the thin protective plate, and the first magnetic flux guide, at said first side of the projection, and the magnetic circuit member at the second side of the projection are driven and translated toward respective, sides of the projection by a force of the resin material flowing into the cavity, so that the opposing surfaces of the thin protective plate and the magnetic circuit member and opposing surfaces of the first and second magnetic flux guides abut on respective surfaces of the projection; and removing the integrally molded Hall sensor device out of the mold after the resin material is set.

3. A method of producing a Hall sensor device as claimed in claim 2, wherein said Hall sensor element comprises a Hall IC.

4. A method of producing a Hall sensor device as claimed in claim 2, wherein the thin protective plate is made of stainless steel.

* * * * *